(12) United States Patent
Lin et al.

(10) Patent No.: US 10,331,547 B1
(45) Date of Patent: Jun. 25, 2019

(54) SYSTEM, METHOD, AND COMPUTER PROGRAM PRODUCT FOR CAPTURE AND REUSE IN A DEBUG WORKSPACE

(71) Applicant: Cadence Design Systems, Inc., San Jose, CA (US)

(72) Inventors: Chien-Liang Lin, San Jose, CA (US); Chung-Wah Norris Ip, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 134 days.

(21) Appl. No.: 15/602,415

(22) Filed: May 23, 2017

(51) Int. Cl.
G06F 11/00 (2006.01)
G06F 11/36 (2006.01)
G06F 17/50 (2006.01)

(52) U.S. Cl.
CPC ........ G06F 11/3664 (2013.01); G06F 11/364 (2013.01); G06F 17/504 (2013.01); G06F 17/5045 (2013.01)

(58) Field of Classification Search
CPC .......................... G06F 11/3664; G06F 11/364
See application file for complete search history.

(56) References Cited

U.S. PATENT DOCUMENTS

| | | | | |
|---|---|---|---|---|
| 5,329,471 A * | 7/1994 | Swoboda | ......... | G01R 31/31853 703/13 |
| 5,991,523 A * | 11/1999 | Williams | ............ | G06F 17/5022 703/15 |
| 6,240,376 B1 * | 5/2001 | Raynaud | ............. | G06F 17/5022 703/14 |
| 6,530,073 B2 * | 3/2003 | Morgan | ............. | G06F 17/5045 716/102 |
| 7,137,078 B2 * | 11/2006 | Singhal | ............... | G06F 17/5022 716/102 |
| 7,437,694 B1 * | 10/2008 | Loh | ...................... | G06F 17/5022 716/136 |
| 8,099,271 B2 * | 1/2012 | Schubert | .......... | G01R 31/31704 703/16 |
| 8,156,147 B1 * | 4/2012 | Tocci | .................... | G06F 17/504 703/3 |

(Continued)

*Primary Examiner* — Marc Duncan
*Assistant Examiner* — Jonathan D Gibson
(74) *Attorney, Agent, or Firm* — Mark H. Whittenberger, Esq.; Holland & Knight LLP

(57) ABSTRACT

The present disclosure relates to a method for reusing a debugging workspace in an electronic design environment. Embodiments may include performing, using a processor, a verification of an electronic design and identifying at least one triggered property associated with the electronic design. Embodiments may further include identifying at least one fan-in signal associated with the at least one triggered property of the electronic design. Embodiments may also include determining a start point debug location based upon, at least in part, the at least one fan-in signal, wherein the start point debug location includes at least one of signal information, cycle information, and event time information. Embodiments may further include generating a debug workspace, wherein generating includes adding at least one additional debug location and storing a cycle of the additional debug location as a relative cycle that is relative to another debug location associated with the debug workspace.

20 Claims, 13 Drawing Sheets

(56) References Cited

U.S. PATENT DOCUMENTS

| | | | |
|---|---|---|---|
| 8,560,991 B1* | 10/2013 | Fuss | G06F 17/5081 324/528 |
| 8,595,684 B1* | 11/2013 | Seng | G06F 17/5045 716/139 |
| 8,726,224 B1* | 5/2014 | Giangarra | G06F 17/5036 716/132 |
| 8,875,069 B1* | 10/2014 | Spacek | G06F 17/5045 716/101 |
| 8,904,321 B1* | 12/2014 | Cohen | G06F 17/5009 716/106 |
| 8,904,332 B1* | 12/2014 | Neal | G06F 17/5068 716/113 |
| 8,910,105 B1* | 12/2014 | Lawson | G06F 17/5077 716/126 |
| 9,189,578 B1* | 11/2015 | Giangarra | G06F 17/5009 |
| 9,202,001 B1* | 12/2015 | Lawson | G06F 17/5077 |
| 9,262,303 B2* | 2/2016 | Schalick | G06F 11/3648 |
| 2002/0133788 A1* | 9/2002 | Waters | G06F 8/44 716/103 |
| 2003/0105620 A1* | 6/2003 | Bowen | G06F 17/5022 703/22 |
| 2003/0145286 A1* | 7/2003 | Pajak | G01R 31/31704 716/106 |
| 2004/0044514 A1* | 3/2004 | Granny | G06F 17/5027 703/23 |
| 2016/0125105 A1* | 5/2016 | Lu | G06F 17/5027 716/136 |
| 2016/0342728 A1* | 11/2016 | Gibson | G06F 17/5068 |

* cited by examiner

Debug Workspace

| | Cycle | Value | Frame Cntr |
|---|---|---|---|
| eg_ad_dataout[7] | 7 | 1'bx | N/A |
| eg_eg_ready | 7 | 1'b0 | 0 |
| eg_int2eg_data | 7 | 8'h7e | 0 |
| brdg_addr_fifo | 6 | 1'b1 | -1 |
| brdg_addr_x_fifo | 6 | 1'b1 | -1 |
| brdg_int_datardy | 6 | 1'b1 | -1 |
| eg_ready | 4 | 1'bx | -3 |

Convert to cycle relative to root of tree

Debug Activities

| | Cycle | Value |
|---|---|---|
| ad_dataout[7] | 7 | 1'bx |
| i_eg_ready | 7 | 1'b0 |
| j_int2eg_data | 7 | 8'h7e |
| brdg_addr_fifo | 6 | 1'b1 |
| brdg_addr_fifo | 6 | 1'b1 |
| brdg_int_datardy | 6 | 1'b1 |
| eg_ready | 4 | 1'bx |

FIG. 5

| Debug Workspace | | | Relevance | Assertion P1 | Assertion P2 | Cover C1 |
|---|---|---|---|---|---|---|
| Signal | Cycle | Value | | | | |
| eg_ad_dataout[7] | 7 | 1'bx | | Relevant | Not Rel. | Not Rel. |
| eg.eg_ready | 7 | 1'b0 | Assertion P1  8 | Relevant | Not Rel. | Relevant |
| eg.int2eg_data | 7 | 8'h7e | Assertion P2  5 | Relevant | Not Rel. | Not Rel. |
| brdg.addr_fifo | 6 | 1'b1 | Cover C1  1 | Relevant | Not Rel. | Not Rel. |
| brdg.addr_fifo | 6 | 1'b1 | -1 | Relevant | Not Rel. | Relevant |
| brdg.int_dataready | 6 | 1'b1 | -1 | Relevant | Relevant | Not Rel. |
| eg_ready | 4 | 1'bx | -3 | Relevant | Relevant | Not Rel. |

| Debug Workspace | | | Shortest | What-if Scenarios | | |
|---|---|---|---|---|---|---|
| | Relative Cycle | Value | | Wf-1 | Wf-2 | Wf-3 |
| eg_ad_dataout[7] | 0 | 1'bx | ✓ | ✓ | ✗ | ✗ |
| eg.eg_ready | 0 | 1'b0 | ✓ | ✓ | ✓ | ✗ |
| eg.int2eg_data | -1 | 8'h7e | ✗ | ✓ | ✗ | ✓ |
| brdg.addr_fifo | -1 | 1'b1 | ✗ | ✓ | ✓ | ✗ |
| brdg.addr_fifo | -1 | 1'b1 | ✗ | ✓ | ✗ | ✗ |
| brdg.int_datardy | -1 | 1'b1 | ✗ | ✗ | ✗ | ✗ |
| eg_ready | -3 | 1'bx | ✗ | ✗ | ✗ | ✗ |
| eg.eg_ad_dataout[7] | | | | | | |

SYSTEM, METHOD, AND COMPUTER PROGRAM PRODUCT FOR CAPTURE AND REUSE IN A DEBUG WORKSPACE

FIELD OF THE INVENTION

The present disclosure relates to electronic design, and more specifically, to a method for debugging in an electronic design.

DISCUSSION OF THE RELATED ART

The process of debugging during verification is a tedious and time consuming task. For example, in the property oriented formal verification, there are many similarities when debugging different failed properties. In existing approaches users run the formal proof to get a list of failed properties. The proof engines can provide the counter example to the user in order to debug the failures in an electronic design automation environment. The user may apply constraints on the current waveform to create a new alternate waveform. If the new waveform fails some existing properties, the user may debug these failures.

Many failed or target properties share similar structural cone of influence ("coi") signals. Many of these may fail because of the same problem, which requires extensive debugging efforts. During what-if analysis, for example, a user may need to verify new generate waveforms again and again on similar signal list to identify the root cause. Moreover, with respect to verifying any register-transfer-level ("RTL") fixes, it is often a tedious effort to check the new design behavior (e.g., the new waveform) against the problem the user is attempting to fix.

SUMMARY OF DISCLOSURE

In one or more embodiments of the present disclosure, a computer-implemented method for use in an electronic design environment. The method may include performing, using a processor, a verification of an electronic design and identifying at least one triggered property associated with the electronic design. The method may further include identifying at least one fan-in signal associated with the at least one triggered property of the electronic design. The method may also include determining a start point debug location based upon, at least in part, the at least one fan-in signal, wherein the start point debug location includes at least one of signal information, cycle information, and event time information. The method may further include generating a debug workspace, wherein generating includes adding at least one additional debug location and storing a cycle of the additional debug location as a relative cycle that is relative to another debug location associated with the debug workspace.

One or more of the following features may be included. In some embodiments, the method may include determining a second debug location from the start point debug location, capturing the relative cycle and forming a location pair. In some embodiments, the verification may be a formal verification. The method may include displaying the relative cycle at a graphical user interface associated with the electronic design environment. The method may also include displaying a debug workspace at the graphical user interface and reusing at least a portion of the debug workspace on one or more of a same trace, a different trace, a same property, and a different property. The method may also include displaying a debug workspace at the graphical user interface and reusing at least a portion of the debug workspace on a different trace from the electronic design. The method may also include displaying a debug workspace at the graphical user interface and reusing at least a portion of the debug workspace on a trace from a revision of the electronic design.

In one or more embodiments of the present disclosure a computer-readable storage medium having stored thereon instructions, which when executed by a processor result in one or more operations is provided. Operations may include performing, using a processor, a verification of an electronic design and identifying at least one triggered property associated with the electronic design. Operations may further include identifying at least one fan-in signal associated with the at least one triggered property of the electronic design. Operations may also include determining a start point debug location based upon, at least in part, the at least one fan-in signal, wherein the start point debug location includes at least one of signal information, cycle information, and event time information. Operations may further include generating a debug workspace, wherein generating includes adding at least one additional debug location and storing a cycle of the additional debug location as a relative cycle that is relative to another debug location associated with the debug workspace.

One or more of the following features may be included. In some embodiments, the method may include determining a second debug location from the start point debug location, capturing the relative cycle and forming a location pair. In some embodiments, the verification may be a formal verification. Operations may include displaying the relative cycle at a graphical user interface associated with the electronic design environment. Operations may also include displaying a debug workspace at the graphical user interface and reusing at least a portion of the debug workspace on one or more of a same trace, a different trace, a same property, and a different property. Operations may also include displaying a debug workspace at the graphical user interface and reusing at least a portion of the debug workspace on a different trace from the electronic design. Operations may also include displaying a debug workspace at the graphical user interface and reusing at least a portion of the debug workspace on a trace from a revision of the electronic design.

In one or more embodiments of the present disclosure, a system for use in an electronic design environment is provided. The system may include at least one processor configured to perform a verification of an electronic design. The at least one processor may be further configured to identify at least one triggered property associated with the electronic design and to identify at least one fan-in signal associated with the at least one triggered property of the electronic design. The at least one processor may be further configured to determine a start point debug location based upon, at least in part, the at least one fan-in signal, wherein the start point debug location includes at least one of signal information, cycle information, and event time information. The at least one processor may be further configured to generate a debug workspace, wherein generating includes adding at least one additional debug location. The at least one processor may be further configured to store a cycle of the additional debug location as a relative cycle that is relative to another debug location associated with the debug workspace.

One or more of the following features may be included. In some embodiments, the at least one processor may be further configured to determine a second debug location from the start point debug location, capture the relative cycle and form a location pair. In some embodiments, the verification may be a formal verification. The at least one processor may be further configured to display the relative cycle at a graphical user interface associated with the electronic design environment. The at least one processor may be further configured to display a debug workspace at the graphical user interface and to reuse at least a portion of the debug workspace on one or more of a same trace, a different trace, a same property, and a different property. The at least one processor may be further configured to display a debug workspace at the graphical user interface and to reuse at least a portion of the debug workspace on a different trace from the electronic design.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 5 is a diagram depicting an embodiment in accordance with the present disclosure;

FIG. 8 is a diagram depicting an embodiment in accordance with the present disclosure;

FIG. 11 is a diagram depicting an embodiment in accordance with the present disclosure;

FIG. 13 is a diagram depicting an embodiment in accordance with the present disclosure.

DETAILED DESCRIPTION

Figure 1:
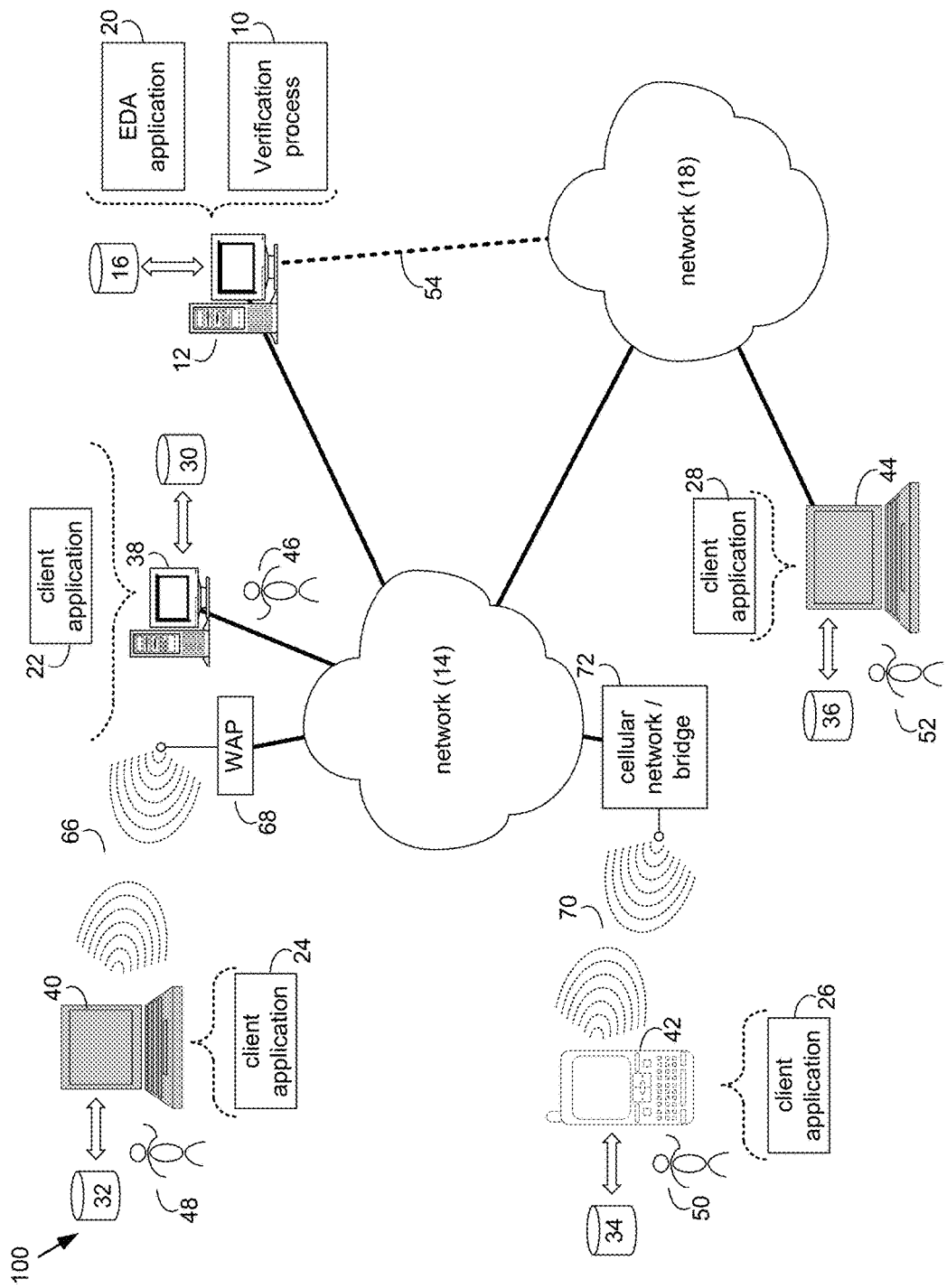
FIG. 1 is a diagram depicting an embodiment of a system in accordance with the present disclosure.

Embodiments of the debugging process described herein may provide a mechanism through which a user may capture debug activities in a debugging workspace without requiring any extra overhead from the user. Embodiments of the debugging process may also be configured to reuse the debugging workspace in various situations. Some of these may include, but are not limited to, reusing the debugging workspace on the same trace on other properties (e.g., to isolate a common root cause to multiple properties), on a different trace from the same design (e.g., to triangulate the root cause by analyzing multiple traces through what-if analysis), and/or on a trace from a revision of the design (e.g., to determine why a proposed change to the design still let an assertion be violated). Accordingly, embodiments included herein may provide the user with a significant productivity gain in these subsequent activities.

As discussed above, many properties fail because of the same problem. However, existing debugging tools throw away the debugging activities after a debugging task is finished. Embodiments of the debugging process included herein may provide a systematic way to capture these activities. Moreover, most debugging tools provide very limited assistance for users when starting a new debugging task. Accordingly, embodiments of the debugging process included herein may reuse the existing workspace so the user does not need to start from scratch repeatedly. Embodiments of the debugging process included herein may also reuse the debugging workspace for different traces, which may reduce the amount of user effort required to find the root cause from a pool of traces. Debugging process may also reuse the debugging workspace to verify the revision of RTL. Each of these concepts and others are described in further detail hereinbelow.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device)

may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a debugging process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, debugging process 10 may reside on and be executed, in whole or in part, by a client electronic device, such as a personal computer, notebook computer, personal digital assistant, or the like.

The instruction sets and subroutines of debugging process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Debugging process 10 may be a stand alone application, or may be an applet/application/script that may interact with and/or be executed within EDA application 20. In addition/ as an alternative to being a server-side process, debugging process 10 may be a client-side process (not shown) that may reside on a client electronic device (described below) and may interact with an EDA client application (e.g., one or more of EDA client applications 22, 24, 26, 28). Further, debugging process 10 may be a hybrid server-side/client-side process that may interact with EDA application 20 and an EDA client application (e.g., one or more of client applications 22, 24, 26, 28). As such, debugging process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize debugging process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
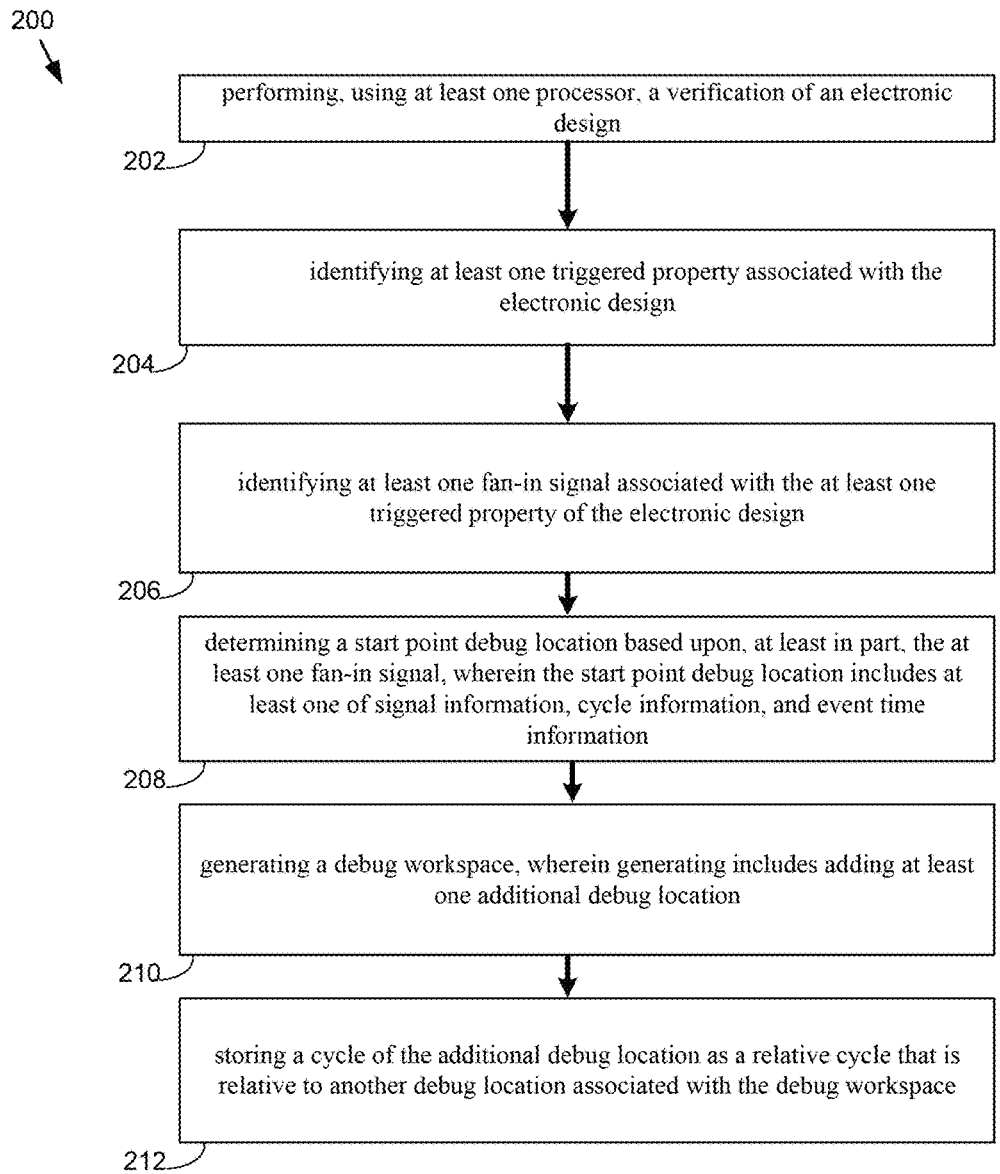
FIG. 2 is a flowchart depicting operations consistent with the debugging process in accordance with an embodiment of the present disclosure.

Referring now to FIG. 2, an exemplary flowchart 200 depicting operations consistent with debugging process 10 is provided. Operations may include performing (202), using a processor, a verification of an electronic design and identifying (204) at least one triggered property associated with the electronic design. Operations may further include identifying (206) at least one fan-in signal associated with the at least one triggered property of the electronic design. Operations may also include determining (208) a start point debug location based upon, at least in part, the at least one fan-in signal, wherein the start point debug location includes at least one of signal information, cycle information, and event time information. Operations may further include generating (210) a debug workspace, wherein generating includes adding at least one additional debug location and storing (212) a cycle of the additional debug location as a relative cycle that is relative to another debug location associated with the debug workspace.

Referring also to FIGS. 3-13, further embodiments consistent with debugging process 10 are provided. In the property oriented formal verification, there are many similarities when debugging different failed properties. Embodiments of the debugging process described herein may be configured to capture similarities of debug context in an executable form and to leverage such information to automatically highlight these similarities in subsequent debugging to avoid repeating tedious steps. Accordingly, debugging process 10 may reduce the effort to find the bug and may also promote the debug automation.

As used herein, the phrase "debugging target" may refer to a violated assertion, an exercised cover point, etc. The phrase "debugging location" may refer to a signal/cycle pair, signal/time pair, etc. The phrase "debugging location tree" may refer to a situation where every node is a debugging location, new children may be added during debugging, and/or the parent-child relationship may be maintained (e.g., driver, why, load, relevant load, etc.). The phrase "debugging workspace" may refer to a set of debugging location trees.

In some embodiments, a debugging location would evaluate a trace at the precise time or cycle specified in the location. However, reusing a single debugging location may not be useful. Embodiments included herein may include reusing a debugging location tree that incorporates the concepts of relative cycle in parent-child relationship and/or relative cycle between the root of the tree to the debugging targets.

Figure 3:
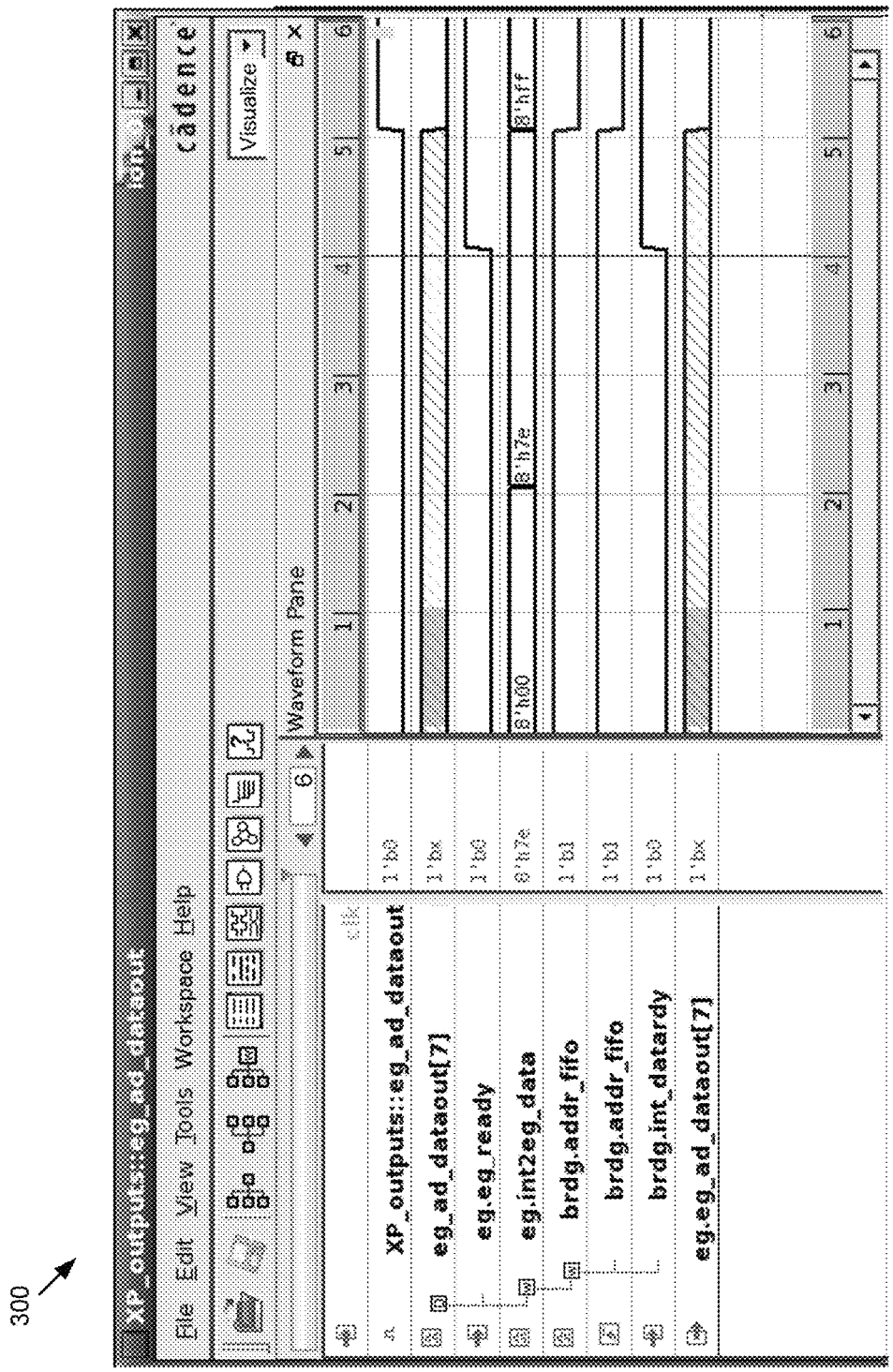
FIG. 3 is a diagram depicting an embodiment in accordance with the present disclosure.
Figure 4:
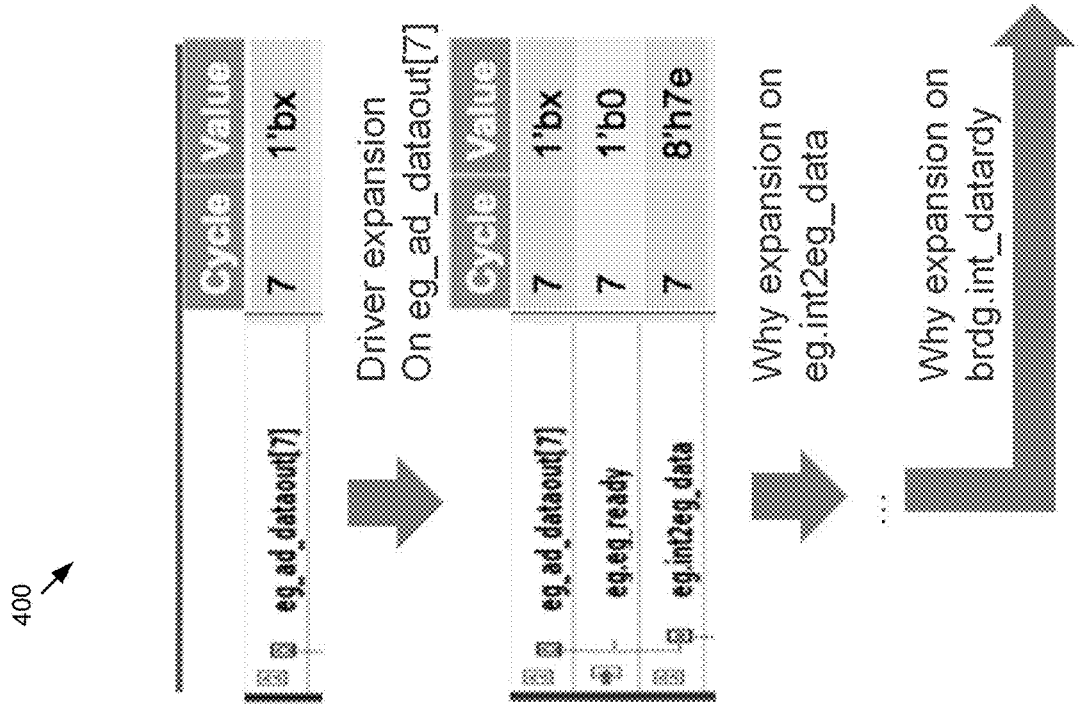
FIG. 4 is a diagram depicting an embodiment in accordance with the present disclosure.

Referring now to FIGS. 3-4, exemplary graphical user interfaces 300 and 400 are provided. GUI 300 shows an example where a user may perform debugging activities while working on a waveform. GUI 300 displays a tree-like structure within a debugging workspace. In this particular example, the user is debugging a property named "XP_outputs: eg_ad_dataout". Here, the user is attempting to plot its drivers, etc., eventually added several signals to the waveform window: eg_ad_dataout[7], eg.eg_ready, brdg.addr_fifo, etc. In some embodiments, a parent-child relationship may be displayed as trees in a waveform window. GUI 400 shows one or more debugging activities that are conducted by a user on waveform A. This particular example, depicts one signal, then three signals leading to seven signals.

Figure 6:
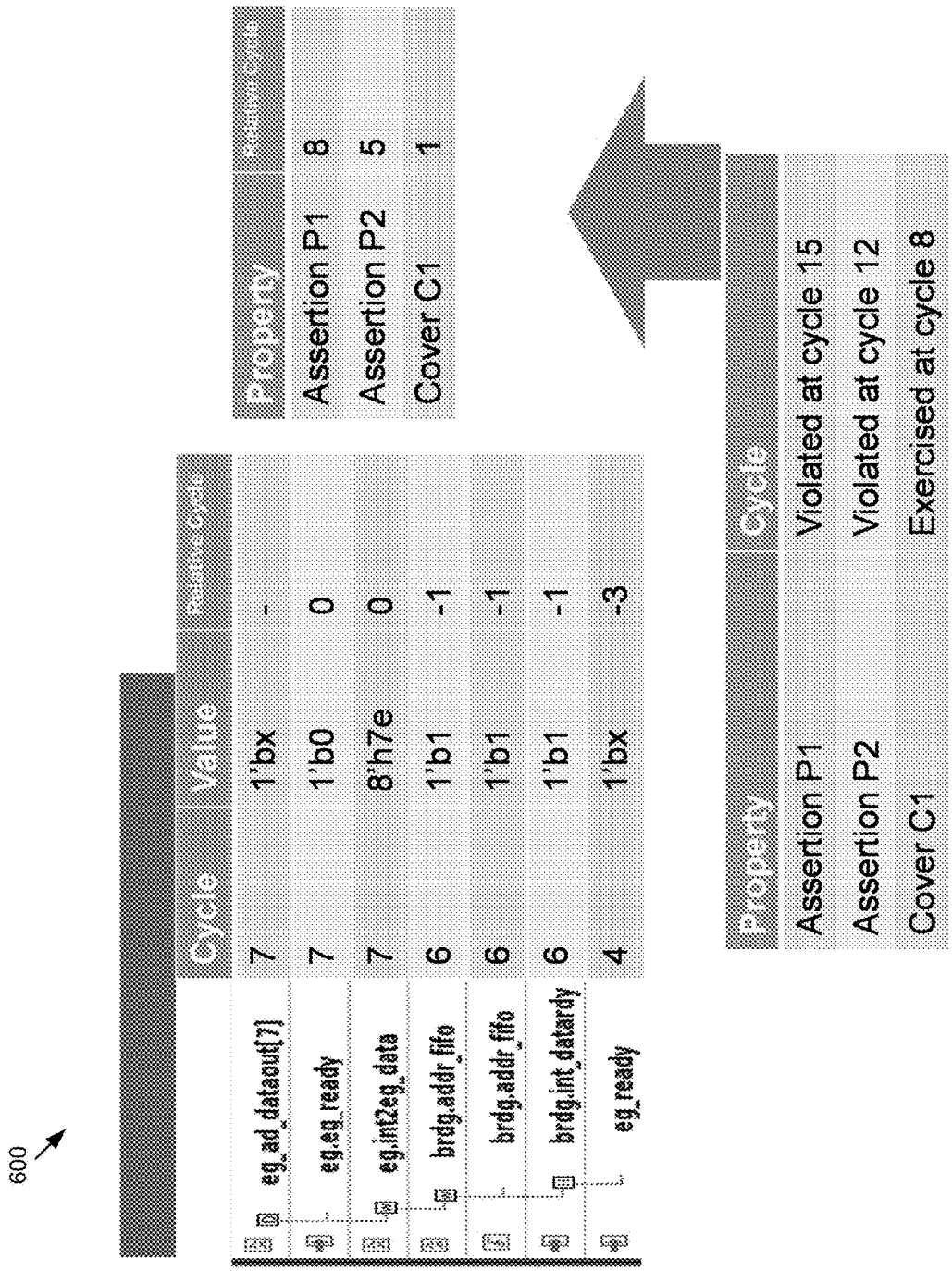
FIG. 6 is a diagram depicting an embodiment in accordance with the present disclosure.
Figure 7:
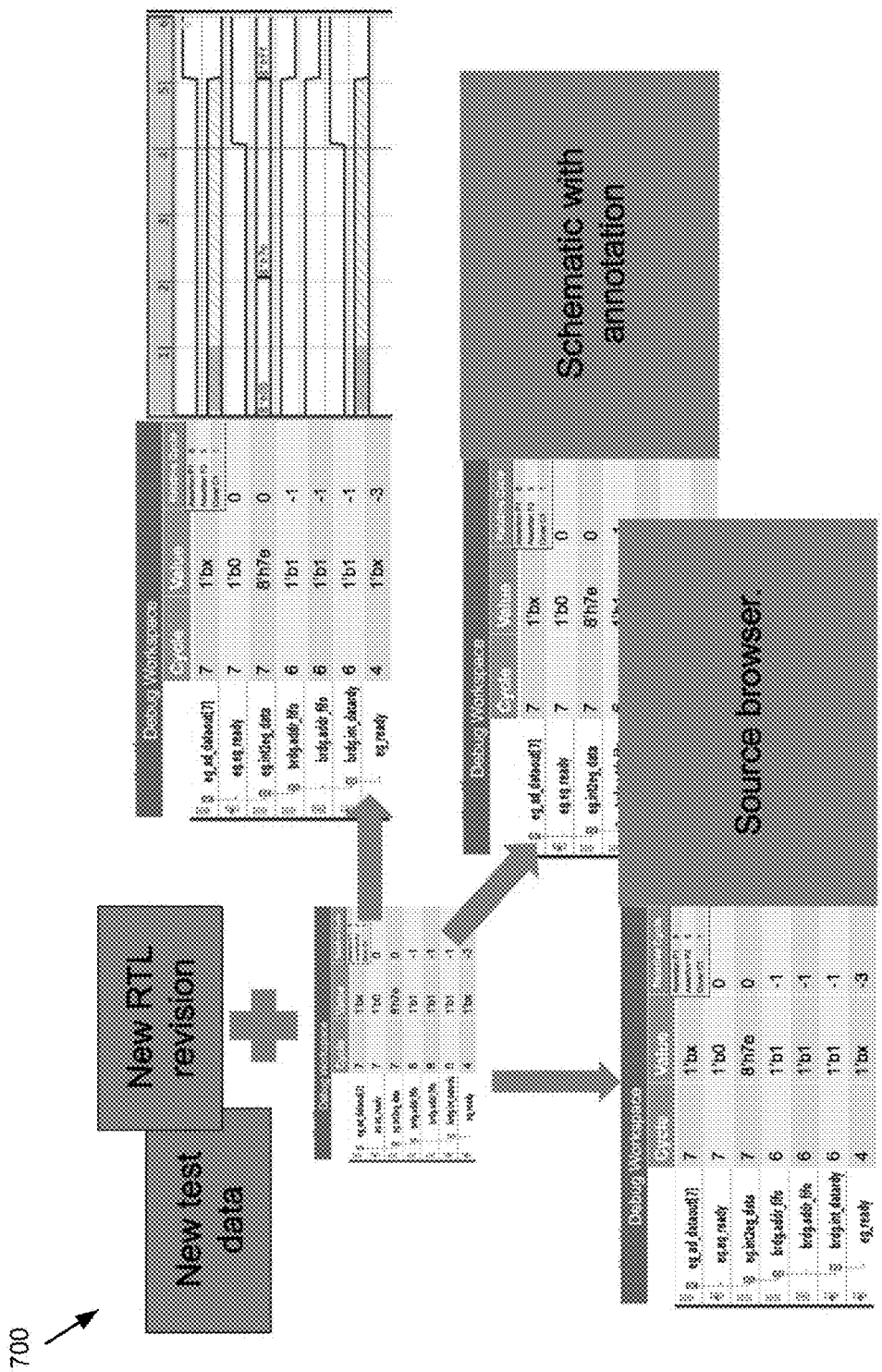
FIG. 7 is a diagram depicting an embodiment in accordance with the present disclosure.

Referring now to FIGS. 5-7, embodiments of debugging process 10 showing the concept of a relative cycle are provided. GUI 500 depicts an example where debugging process 10 may capture and display a debugging workspace from various debugging activities. Accordingly, the debugging workspace may be configured to capture the debugging locations in a tree structure. In some embodiments, the immediate fan-in signals of a failed property typically provide the start point of first set of debug locations. Each debugging location may include, but is not limited to, signal information, cycle information, and/or event time information. Evaluation of a debug location may capture the value of the signal at the given cycle as well as the relative cycle. As is shown in FIG. 5, the process may convert to a cycle relative to a root of a tree. This relative cycle may be portable and reusable in later operations as is discussed in further detail hereinbelow. Additionally and/or alternatively, debugging process 10 may allow for the annotation of a debugging workspace with debugging targets as is shown in FIG. 6.

In some embodiments, new debugging locations may be added and evaluated as children of an existing debug location. For example, a signal_a@6 has 1'b0 and run "why" to get two children out of three drivers. For example: signal_c@4 has 32'f01 and run "driver" to get all three drivers as children. Repeating this debug trace step, a user might find the incorrect inputs, or design defects. "Driver signals", as used herein, may refer to all possible signals that can affect the value of the target signal in all conditions. "Why signals", as used herein, may refer to one or more driver signals that affect the value of the target signal in current condition (e.g., a current cycle). Repeating this step may create a tree with one root debug location. A debug workspace may consist of one or more trees. In some embodiments, repeating the identification of signal information, cycle information, and/or event time information and subsequently evaluating a debug location may eventually allow the user to identify a "root cause" debug location as the root cause of a debug target (e.g., violated assertion, exercised cover point, etc.). FIG. 6 also lists all properties in the user design that also exercise the signal behavior captured in the debugging workspace. The behavior may occur in the different cycles in different properties. These properties may include the candidates to reuse the debugging workspace.

In some embodiments, and referring also to FIG. 7, debugging process 10 may be implemented in an integrated environment to assist the user in locating the next debug locations. For example, any or all of the aspects discussed herein (e.g. the debugging workspace) may be associated with a source browser, waveform, signal browser, schematic, graph, etc. Debugging process 10 may enable the selection of a debug location and applying a constraint to evaluate the effect of a potential fix in the RTL at this area. FIG. 7 depicts an example of how this debugging workspace may be used in subsequent debug activities by the user. For example, previously saved debugging workspace may be used to bring up the signals and annotations in various debugging environments. In some embodiments, a cycle may be updated based upon a relative cycle from old test data. It should be noted that the relative cycle column depicted in FIG. 7 may or may not be displayed based upon user preferences or settings.

Figure 9:
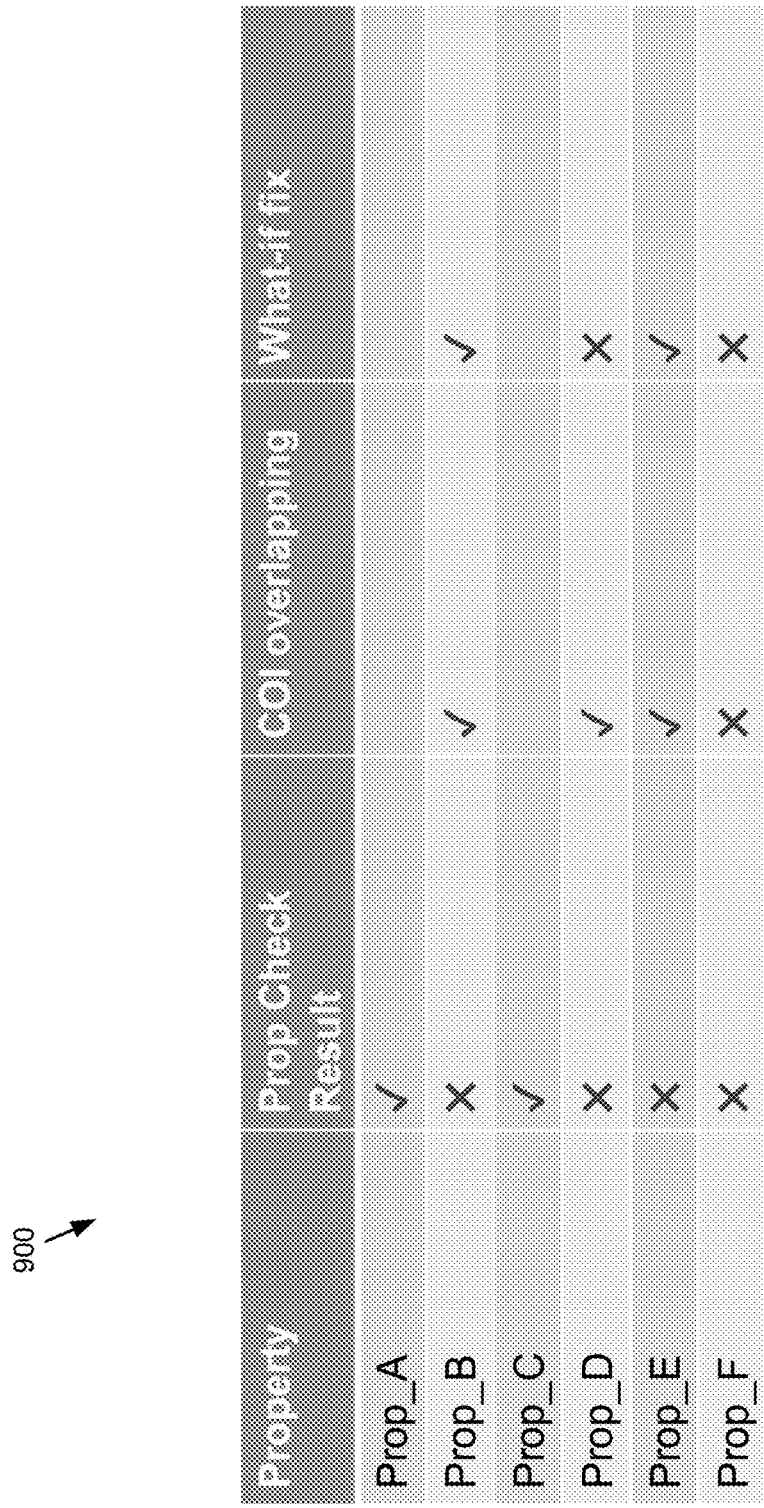
FIG. 9 is a diagram depicting an embodiment in accordance with the present disclosure.

Referring now to FIGS. 8-9, embodiments of debugging process 10 may be configured to allow for the reuse of a debugging workspace on the same trace on other properties. Additionally and/or alternatively, debugging process may operate on different or alternate traces, and different properties or the same property as well.

For example, GUI 800 provides a mechanism where the user may be able to locate the potential properties which can reuse similar debug locations in workspace while working on the same trace. In this example, a user may run a "property check" and obtain the list of failed assertions and exercised cover points. As is shown in FIG. 8, an indication of whether an assertion is or is not relevant may be provided. Additional information regarding relevancy determinations may be found in U.S. Pat. Nos. 7,137,078 and 7,437,694, which are each incorporated by reference herein in their entirety. In some cases, an indication of relevancy may indicate that the item is highly reusable.

In some embodiments, reusing the debugging workspace may be applied in a number of different situations. Some of these may include reusing the debugging workspace for one or more properties for the same trace or for one or more properties for different traces. This reuse may be for the same property or for different properties. This reuse may include checking the overlap of COI signals of failed properties and the signals of debug locations in the debug workspace. The properties that overlap with the debug workspace might share with the bug captured by this workspace. In some embodiments, the process, with or without user intervention, may apply the "what-if" fix to these property to check if they are fixed. The phrase "What-if", as used herein, may refer to an interactive process that allows a user to provide more constraints (e.g., signal expression, implication, etc.) to limit the possible waveform behaviors. Using the CEX trace example, a user may attempt to add different constraints to check if CEX can no longer be generated by formal engine. Debugging process 10 may evolve the debug workspace with more or less debug location on these failed properties. Any or all of these reuse operations may be performed automatically by debugging process 10. FIG. 9 depicts an example of a debugging workspace analysis table 900. In this example, Prop_B and Prop_E may have been fixed in current debug workspace benefited by debug automation. In operation, the user may begin the debugging process based on the current debug workspace, which provides various types of information. It should be noted that within Table 900 the check marks may indicate relevant results.

Figure 10:
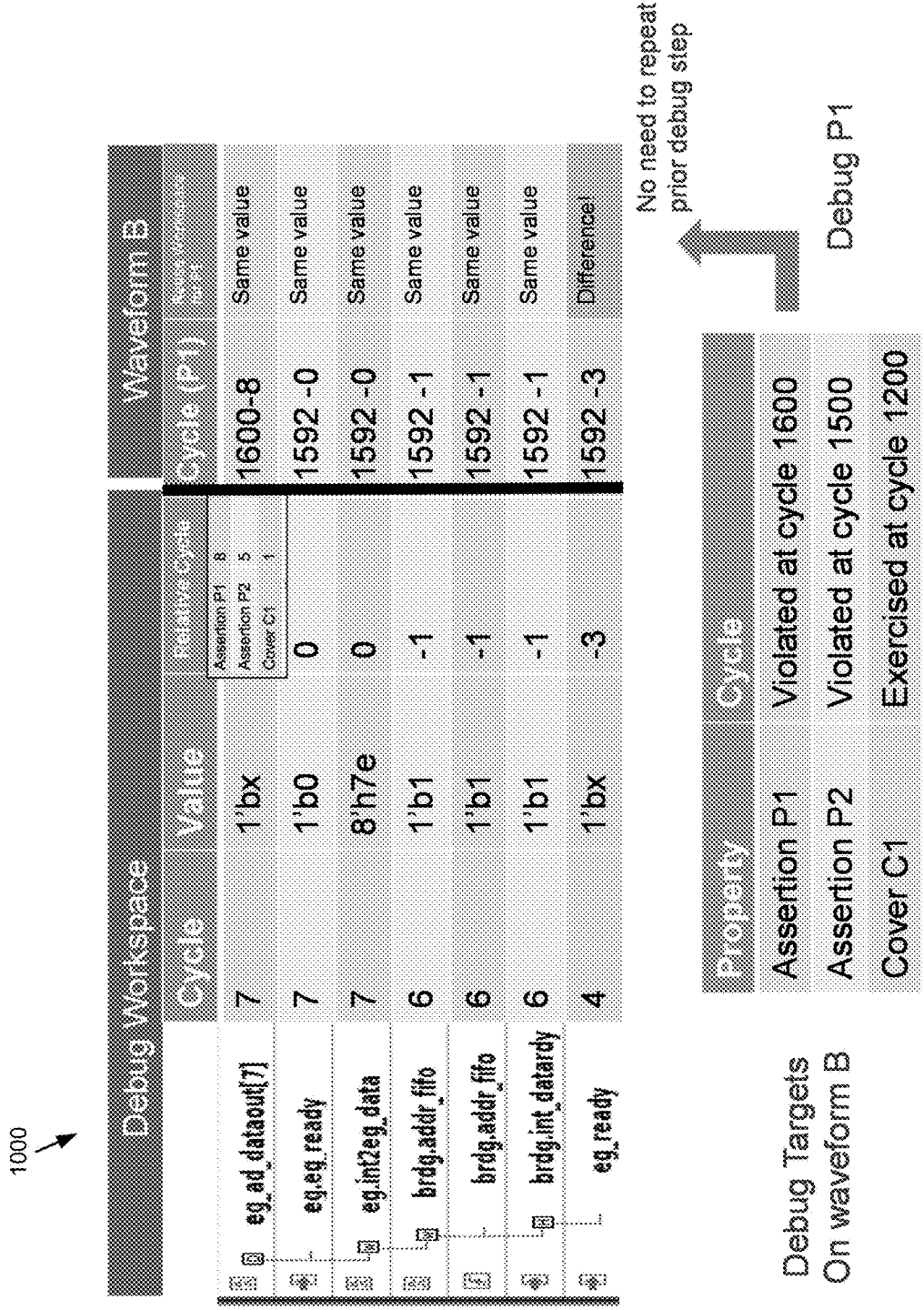
FIG. 10 is a diagram depicting an embodiment in accordance with the present disclosure.
Figure 12:
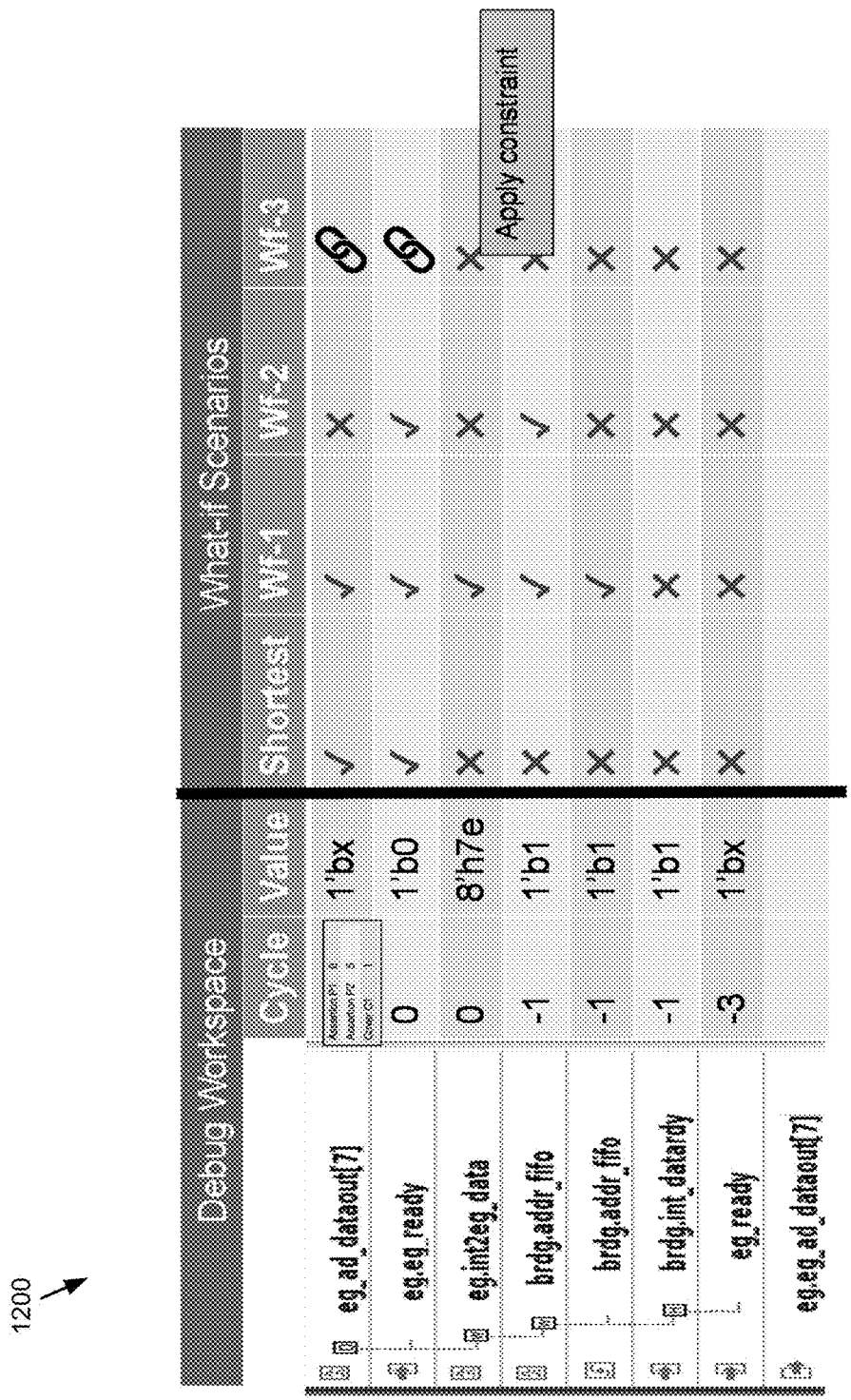
FIG. 12 is a diagram depicting an embodiment in accordance with the present disclosure.

Referring now to FIGS. 10-12, embodiments of debugging process 10 depicting examples of reusing debugging workspaces on a different trace from the same design are shown. Debugging process 10 may operate not only upon different waveforms but also the same waveform. As is shown in FIG. 10, GUI 1000 may be configured to highlight whether or not the values are the same or different in one or more relevant activities. In operation, the user may be debugging targets on waveform B (e.g. P1). It should be noted that although the waveform B table is displayed in FIG. 10 this table may be hidden as desired. This example shows that it may be unnecessary to repeat the prior debugging step. The different value may indicate via a color change in the table and/or via a color change in the waveform viewer. Numerous alternatives are also within the scope of the present disclosure.

Referring now to FIG. 11, an embodiment of debugging process displaying an example user workspace and what-if scenarios is provided. In some embodiments, a checkmark may indicate that the debug location is a match (e.g., exercised with the same value and at the same relative cycle to the exercised originating debug location in a debug location pair) in the What-if trace. A cross mark may indicate that the debug location is not a match (e.g., not exercised). A user may apply a property which has a different what-if scenario and check that against the current debugging workspace. In the example above, the user may use Wf-1 to evolve the debug workspace. Additionally and/or alternatively, the number of red cross marks under Wf-3 may indicate that the behavior is not the same as the debugging workspace. Wf-2 and Wf-3 may indicate that the behavior is not the same as the debugging workspace. However, Wf-3 shows that the user may apply the debug locations in the debugging workspace (e.g., the chain icons under Wf-3) as the constraints of Wf-3. With these new applied constraints, Wf-3 may change its behavior and make it possible to reuse the debugging workspace similar to Wf-1.

Referring now to FIG. 12, another embodiment of debugging process displaying an example user workspace and what-if scenarios is provided. In this example, the user may apply one or more debugging locations as constraints. In the what-if scenario, the user may apply the "not match" debugging locations as the constraints of the what-if scenario and then re-examine the debugging workspace against a new trace that has exercised the specified debug location. In some embodiments, the user may apply as many debugging locations as possible before over constraint and then re-use the debugging workspace to perform the debugging.

Figure 13:
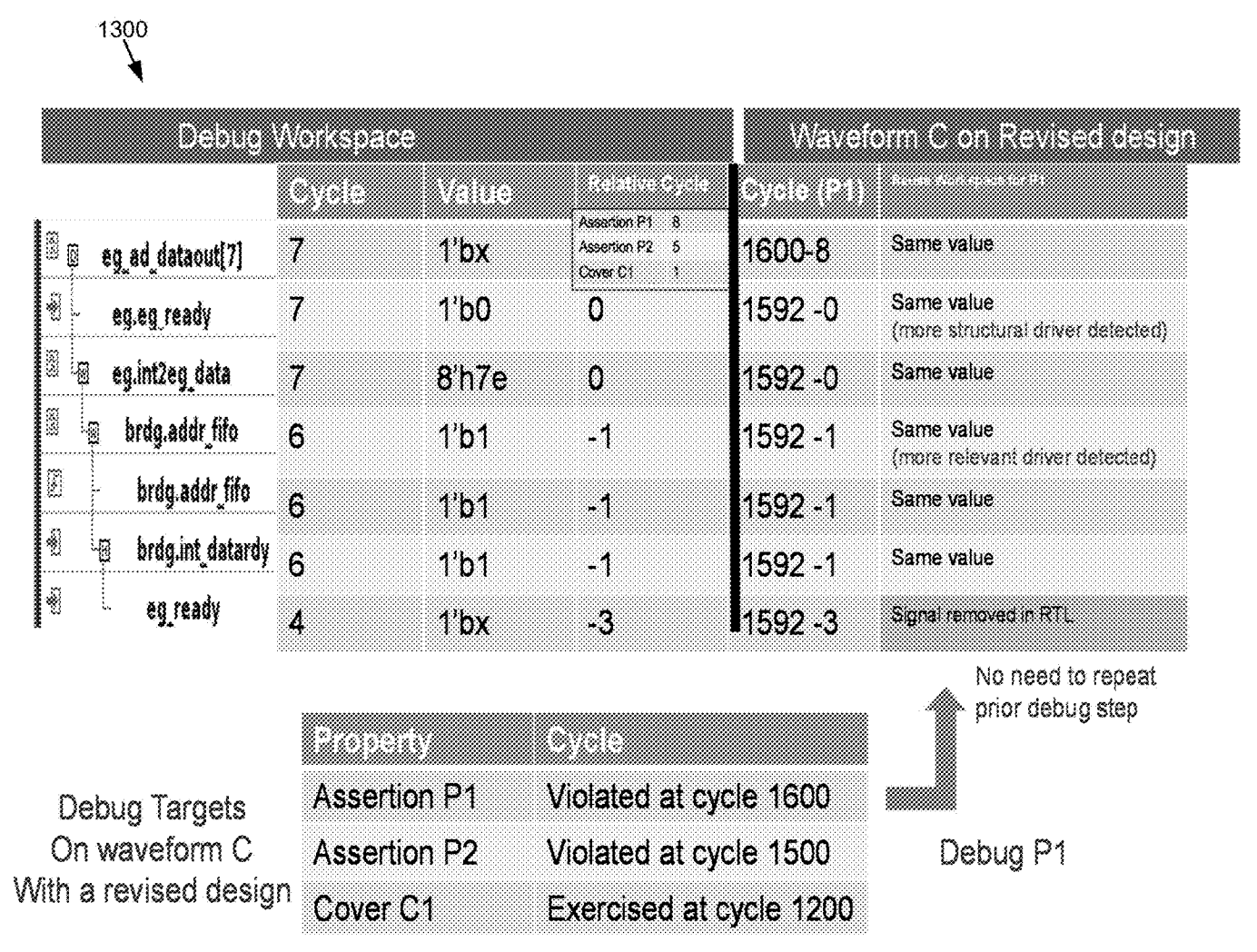

Referring now to FIG. 13, another embodiment of debugging process 10 displaying the reuse of a debugging workspace on a trace from a revision of the design is provided. In this example, GUI 1300 may be used to highlight relevant RTL differences. In this way, this example may help a user to understand why a fix to the RTL design description still triggered the same failed property. In this example, a user may be debugging targets on waveform C with a revised design. In some embodiments, the waveform C revised information may be provided on a waveform as opposed to the Table shown in FIG. 13.

It should be noted that embodiments of debugging process 10 described herein may be applied to any verification method that uses properties to monitor activities, so that there would be triggered properties, such as failed assertions. In some embodiments triggered properties, may include, but are not limited to, failed assertions and exercised cover points.

In some embodiments, and as discussed above, debugging process 10 may allow for the reuse of a workspace on a different property. In some cases this may include one or more of the following operations. Identifying a second triggered property, identifying a second fanin signal, determining a second start point debug location, expanding the workspace by adding at least a second start point debug location, and/or repeating until the newly determined debug location is already in the workspace from the analysis of the first property.

Additionally and/or alternatively, in some embodiments debugging process 10 may allow for the reuse of the workspace on a different trace from the same or a revision of the design. In some embodiments, debugging process 10 may be configured to identify the new cycle in which the same property is triggered in the revised design, identifying the same fanin signal, and/or taking the original start point debug location in the original workspace, determining the new start point debug location as the debug location comprising of the same fanin signal at the same relative cycle to the trigger property. Any or all of these operations may also be performed for the rest of the original debug locations.

In some embodiments, debugging process 10 may be configured to iteratively take the rest of the original debug location pair in the original workspace, having a new debug location determined from one location in the pair. If the new location has the same value as the original one, debugging process 10 may determine the new debug location of the second location in the pair and add to the workspace.

Embodiments of debugging process 10 may provide a painless way to capture the user's debug activities as a debugging workspace. The system may apply this debugging workspace to target properties automatically. Debugging process 10 may provide a comprehensive result minimize the time required to debug similar issues. Debugging process 10 may also save interactive debug efforts when user work on the multiple reversion of waveform results.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for use in an electronic design environment comprising:
    performing, using at least one processor, a verification of an electronic design;
    identifying at least one triggered property associated with the electronic design;
    identifying at least one fan-in signal associated with the at least one triggered property of the electronic design;
    determining a start point debug location based upon, at least in part, the at least one fan-in signal, wherein the start point debug location includes at least one of signal information, cycle information, and event time information;
    generating a debug workspace, wherein generating includes adding at least one additional debug location; and
    storing a cycle of the additional debug location as a relative cycle that is relative to another debug location associated with the debug workspace.

2. The computer-implemented method of claim 1 further comprising:
    determining a second debug location from the start point debug location;
    capturing the relative cycle; and
    forming a location pair.

3. The computer-implemented method of claim 2 wherein the verification is a formal verification.

4. The computer-implemented method of claim 3 further comprising:
displaying the relative cycle at a graphical user interface associated with the electronic design environment.

5. The computer-implemented method of claim 3 further comprising:
displaying a debug workspace at the graphical user interface; and
reusing at least a portion of the debug workspace on one or more of a same trace, a different trace, a same property, and a different property.

6. The computer-implemented method of claim 3 further comprising:
displaying a debug workspace at the graphical user interface; and
reusing at least a portion of the debug workspace on a different trace from the electronic design.

7. The computer-implemented method claim 3 further comprising:
displaying a debug workspace at the graphical user interface; and
reusing at least a portion of the debug workspace on a trace from a revision of the electronic design.

8. A non-transitory computer-readable storage medium having stored thereon instructions that when executed by a machine result in the following operations:
performing, using at least one processor, a verification of an electronic design;
identifying at least one triggered property associated with the electronic design;
identifying at least one fan-in signal associated with the at least one triggered property of the electronic design;
determining a start point debug location based upon, at least in part, the at least one fan-in signal, wherein the start point debug location includes at least one of signal information, cycle information, and event time information;
generating a debug workspace, wherein generating includes adding at least one additional debug location; and
storing a cycle of the additional debug location as a relative cycle that is relative to another debug location associated with the debug workspace.

9. The computer-readable storage medium of claim 8 further comprising:
determining a second debug location from the start point debug location;
capturing the relative cycle; and
forming a location pair.

10. The computer-readable storage medium of claim 9 wherein the verification is a formal verification.

11. The computer-readable storage medium of claim 10 further comprising:
displaying the relative cycle at a graphical user interface associated with the electronic design environment.

12. The computer-readable storage medium of claim 10 further comprising:
displaying a debug workspace at the graphical user interface; and
reusing at least a portion of the debug workspace on one or more of a same trace, a different trace, a same property, and a different property.

13. The computer-readable storage medium of claim 10 further comprising:
displaying a debug workspace at the graphical user interface; and
reusing at least a portion of the debug workspace on a different trace from the electronic design.

14. The computer-readable storage medium of claim 10 further comprising:
displaying a debug workspace at the graphical user interface; and
reusing at least a portion of the debug workspace on a trace from a revision of the electronic design.

15. A system for use in an electronic design environment comprising:
a computing device having at least one processor configured to perform a verification of an electronic design, the at least one processor further configured to identify at least one triggered property associated with the electronic design and to identify at least one fan-in signal associated with the at least one triggered property of the electronic design, the at least one processor further configured to determine a start point debug location based upon, at least in part, the at least one fan-in signal, wherein the start point debug location includes at least one of signal information, cycle information, and event time information, the at least one processor further configured to generate a debug workspace, wherein generating includes adding at least one additional debug location, the at least one processor further configured to store a cycle of the additional debug location as a relative cycle that is relative to another debug location associated with the debug workspace.

16. The system of claim 15 wherein the at least one processor is further configured to determine a second debug location from the start point debug location, capture the relative cycle and form a location pair.

17. The system of claim 16 wherein the verification is a formal verification.

18. The system of claim 17 wherein the at least one processor is further configured to display the relative cycle at a graphical user interface associated with the electronic design environment.

19. The system of claim 17 wherein the at least one processor is further configured to display a debug workspace at the graphical user interface and to reuse at least a portion of the debug workspace on one or more of a same trace, a different trace, a same property, and a different property.

20. The system of claim 17 wherein the at least one processor is further configured to display a debug workspace at the graphical user interface and to reuse at least a portion of the debug workspace on a different trace from the electronic design.

* * * * *